United States Patent [19]

Tanimoto

[11] Patent Number: 4,884,101

[45] Date of Patent: Nov. 28, 1989

[54] APPARATUS CAPABLE OF ADJUSTING THE LIGHT AMOUNT

[75] Inventor: Akikazu Tanimoto, Yokohama, Japan

[73] Assignee: Nikon Corporation, Tokyo, Japan

[21] Appl. No.: 151,188

[22] Filed: Feb. 1, 1988

[30] Foreign Application Priority Data

Feb. 3, 1987 [JP] Japan .................................. 62-21677
Feb. 5, 1987 [JP] Japan .................................. 62-23640
Feb. 5, 1987 [JP] Japan .................................. 62-23641

[51] Int. Cl.⁴ ............................................. G03B 27/72
[52] U.S. Cl. ......................................... 355/68; 355/53; 355/69; 355/71
[58] Field of Search ....................... 355/53, 68, 69, 71; 315/141 P

[56] References Cited

U.S. PATENT DOCUMENTS

4,506,977 3/1985 Sata et al. ............................. 355/53
4,512,657 6/1985 Sakato .................................. 355/68
4,712,910 12/1987 Sakato .............................. 355/69 X Primary Examiner—L. T. Hix
Assistant Examiner—D. Rutledge
Attorney, Agent, or Firm—Shapiro and Shapiro

[57] ABSTRACT

An apparatus for applying radiation to an object, such as pulsed laser light for exposing a semiconductor substrate, for example, applied through a shutter, includes a control system that determines the amount of light applied to the object. In one embodiment, the timing of light pulses ensures that a pulse is emitted at the time of complete shutter opening and also at the time of the start of shutter closing. In another embodiment, the period from the commencement of shutter closing to the completion of shutter closing is controlled so that it is an integer times the light pulse repetition period. The apparatus may also include a light energy detector, and the control system may calculate the amount of applied radiation and shutter operating periods.

17 Claims, 9 Drawing Sheets

APPARATUS CAPABLE OF ADJUSTING THE LIGHT AMOUNT

BACKGROUND OF THE INVENTION

1. Field of the Invention

This invention relates to a light amount adjusting apparatus in an apparatus utilizing a light source which emits pulse light, and for example, to an exposure apparatus using an excimer laser to project a mask pattern onto a semiconductor wafer.

2. Related Background Art

Heretofore, in a reduction projection type exposure apparatus used in the lithography process of the manufacture of integrated circuits, i.e., a so-called stepper, a super-high pressure mercury lamp has been used as a light source for exposure.

This super-high pressure mercury lamp outputs light of plural wavelengths, and with the improvement in the resolving power required in the lithography, the wavelength of the light utilized has become shorter, and not only light of a wavelength of 436 nm but also light of a wavelength of 365 nm has come to be utilized.

However, for any shorter wavelengths, the amount of energy thereof is small and only lithography of very low throughput can be realized.

Attention has recently been paid to excimer laser as a solution to such a problem.

SUMMARY OF THE INVENTION

It is the object of a present invention to provide an apparatus which is capable of accurately adjusting the exposure amount when a substrate to be exposed is exposed by the use of a light source periodically emitting light, such as an excimer laser.

BRIEF DESCRIPTION OF THE DRAWINGS

FIGS. 1 (A)–(D) illustrate the principle of the present invention.

FIGS. 3 (A) and (B) illustrate the relation between the shutter opening-closing operation in such embodiment and the light emission timing of a laser source.

FIGS. 11 (A)–(C) and 12 illustrate the principle of a further improved embodiment of the present invention.

DESCRIPTION OF THE PREFERRED EMBODIMENTS

The use of an excimer laser can provide intense light at wavelengths 308 nm, 249 nm, 193 nm, etc. This laser has a property of being oscillated and of producing an output in a pulse-like form in a time width of 10 to 20 nsec.

Figure 1:
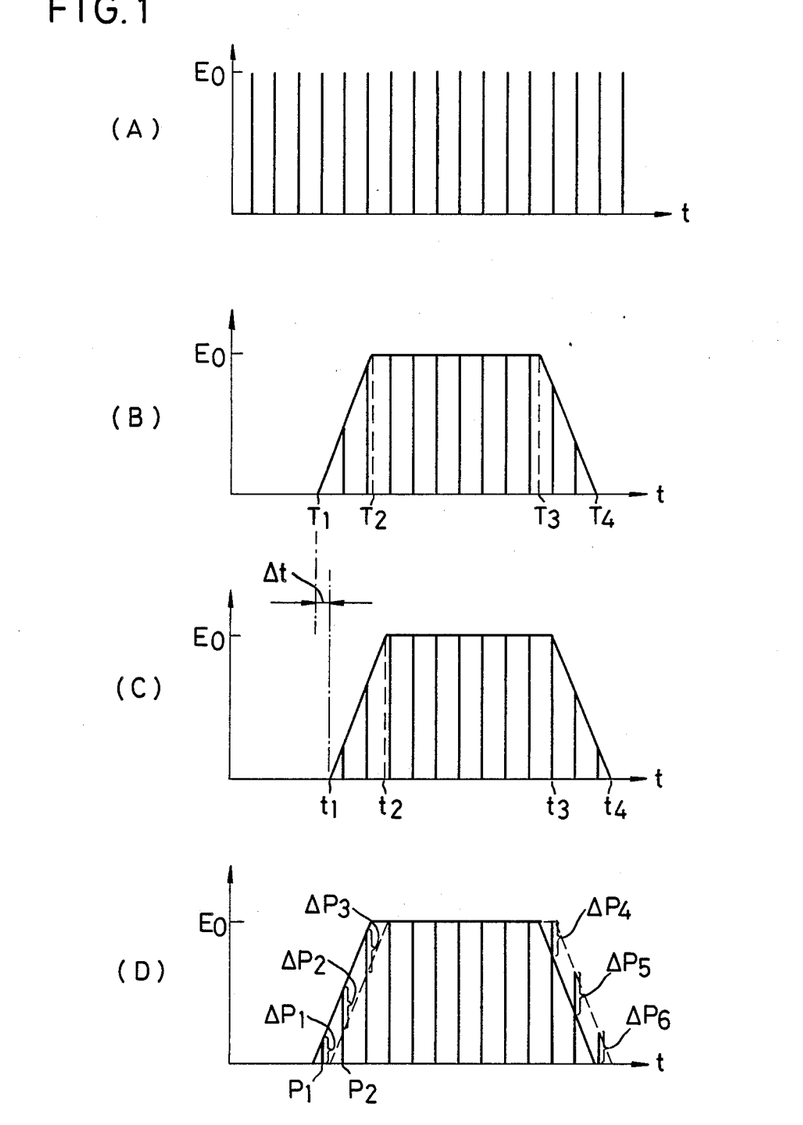

In FIG. 1, there is shown a case where in an exposure apparatus, the excimer laser is repetitively oscillated substantially at a predetermined interval and the opening-closing of a shutter is effected to control the exposure amount.

First, the output of the excimer laser is put out in a pulse-like form, for example, at a predetermined period, as shown in FIG. 1 (A).

The opening-closing of the shutter takes a predetermined time. Therefore, assuming that the amount of energy of the pulse passing through the shutter in its fully opened state is Eo, the amount of energy passing through the shutter when it is being opened and closed is less than Eo.

In FIG. 1 (B), there is shown a pulse transmitted through the shutter when the opening operation of the shutter is performed from time T1 till time T2 and the closing operation of the shutter is performed from time T3 till time T4.

In this figure, the whole amount of energy of the pulse passing through the shutter during a series of opening-closing operations is the sum of the energy of each pulse (the product of the pulse width and the intensity of light).

In FIG. 1 (C), there is shown a pulse transmitted through the shutter when the opening operation of the shutter is performed from time t1 till time t2 and the closing operation of the shutter is performed from time t3 till time t4. In this example, as compared with the case of FIG. 1 (B), the time when the opening operation is started differs by $\Delta t$.

FIG. 1 (D) shows the graphs of FIGS. 1 (B) and 1 (C) as they are superposed one upon the other.

However, in the light amount control system by the opening-closing of the shutter as described above, the pulse number included in the shutter-open time is small, and this leads to the inconvenience that the control of the light amount cannot be accomplished.

As is apparent from the reference to FIG. 1 (D), the whole light amount passing through the shutter is varied by a slight difference in the timing of rising.

More particularly, in the first pulse P1 passing through the shutter, there occurs a difference $\Delta P1$ in the light amount. Likewise, in the second pulse P2, there occurs a difference $\Delta P2$ in the light amount. This also holds true when the shutter is closed.

Accordingly, the difference $\Delta P$ in the light amount as a whole is $$\Delta P = \Delta P1 + \Delta P2 + \Delta P3 - \Delta P4 - \Delta P5 - \Delta P6.$$

As described above, even if the output energy per pulse is controlled to Eo, there occurs the inconvenience that irregularity is caused in the shutter-passed energy by the deviation between the pulse output and the timing of the opening-closing of the shutter.

Figure 2:
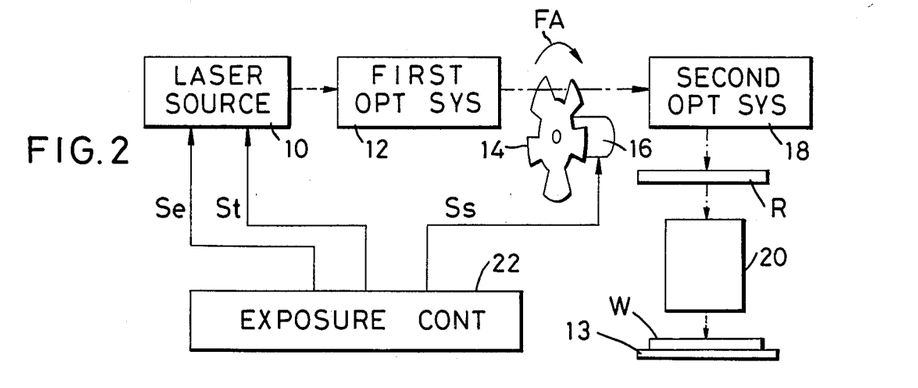
FIG. 2 shows the construction of an embodiment of the present invention.

In FIG. 2, there is shown the construction of an embodiment of the present invention. In FIG. 2, a laser source 10 is a light source emitting light in a pulse-like form, such as an excimer laser. The output pulse of this laser source 10 may be transmitted through a first illumination optical system 12 and enter a shutter 14.

The first illumination optical system 12 has the function of deforming an input pulse laser beam so as to assume the necessary beam section intensity distribution and divergence (or convergence) characteristic and outputting it to the shutter 14.

Also, the shutter 14 is adapted to be rotatively control-driven for opening-closing, for example, in the direction of arrow FA, by a shutter driver 16.

Figure 3:
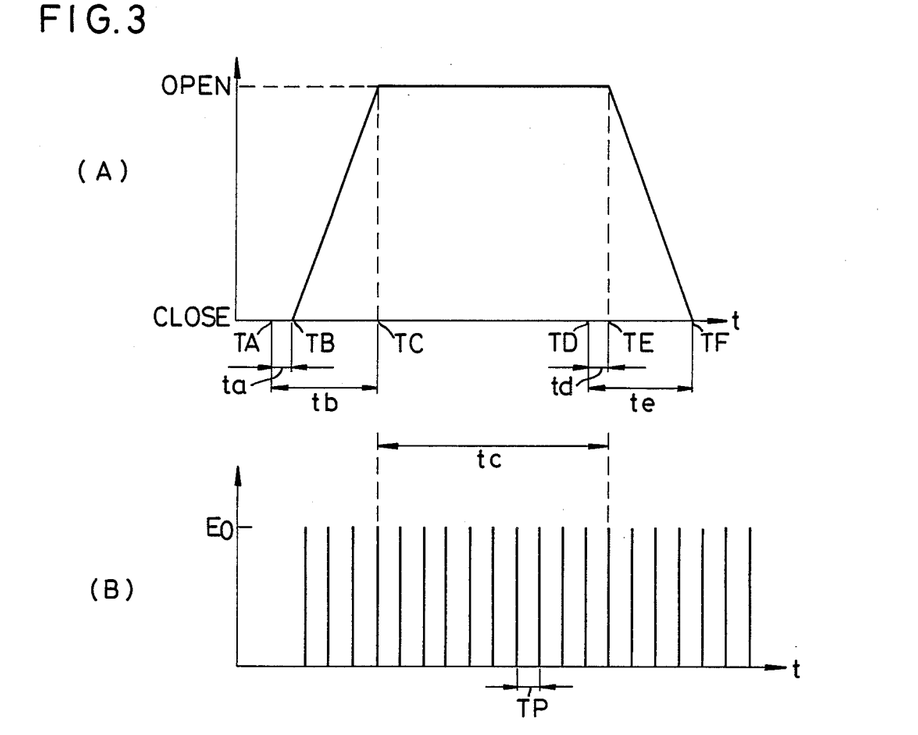

In FIG. 3 (A), there is shown an example of the variation in the opening-closing operation of such shutter 14 with time. In this figure, the abscissa represents time, and the ordinate represents the degree of open state.

A command for opening is effected at time TA, and the opening operation is started from time TB and the laser beam begins to be transmitted, and the shutter becomes fully open at time TC and the laser beam completely passes therethrough. Also, a command for closing is effected at time TD, and the closing operation is started from time TE and the shutter 14 begins to intercept the laser beam, and the shutter becomes fully closed at time TF and the laser beam is completely intercepted.

In the opening-closing operation of the shutter 14 as described above, the delay time ta from after the command for opening is effected until the opening operation is started, the time tb from the command for opening until the shutter is fully opened, the delay time td from the command for closing until the closing operation is started, and the time te from the command for closing until the shutter is fully closed are predetermined as the characteristics of the construction of the apparatus in this embodiment and are substantially constant. The time tc is the time from the termination of the opening operation until the closing operation is started.

The pulse light passed through such shutter 14 may be transmitted through a second illumination optical system 18 and enter a reticle R.

The second illumination optical system 18 has the function of causing the incident pulse beam to enter only the necessary circuit pattern area on the reticle R with a uniform intensity distribution. Particularly, it has an optical system for reducing speckles peculiar to the laser beam, an optical integrator for making a plurality of secondary light source images, a condenser lens, etc.

The reticle R is formed with a circuit pattern to be projected onto a wafer W on a stage 13.

The pulse light, i.e., the exposure light, transmitted through the reticle R may enter the wafer W through a projection optical system 20 and the projection of the circuit pattern of the reticle R may be effected.

An exposure controlling part 22 is connected to the laser source 10 and the shutter driver 16. The exposure controlling part 22 is comprised of a microcomputer, a pulse generator, a memory, a gate circuit, etc.

An exposure starting signal Sexp indicative of the fact that the wafer W has been placed on the stage 13 and an exposure amount signal Sdose corresponding to the predetermined proper exposure amount of the wafer W may be input from the outside to the exposure controlling part 22.

The exposure controlling part 22 outputs an energy command signal Se and a light emission trigger signal St to the laser source 10 on the basis of the exposure starting signal Sexp and the exposure amount signal Sdose. The light emission trigger signal St corresponds to a pulse generated at a predetermined time interval TP from the pulse generator in the exposure controlling part 22.

Of these signals, the energy command signal Se sets the amount of energy per pulse.

The light emission trigger signal St indicates the light emission timing of the laser source 10.

Also, the exposure controlling part 22 has the function of outputting a drive control signal Ss for effecting the drive control of the shutter 14 by the shutter driver 16. The command for opening and the command for closing are included in this drive control signal Ss.

The general operation of the above-described embodiment will now be described with reference to the flow chart of FIG. 4.

It is to be understood that the laser pulses of the laser source 10, as shown in FIG. 3 (B), are output-controlled at the substantially constant interval TP after the opening operation of the shutter 14.

A description will first be given of the relation between the opening-closing operation of the shutter 14 shown in FIG. 3 (A) and the output timing of the laser pulses shown in FIG. 3 (B).

As described above, the time interval of the opening-closing operation of the shutter 14, i.e., the time ta from the command for opening until the opening operation is started, the time tb from the command for opening until the shutter is fully opened, the time td from the command for closing until the closing operation is started, and the time te from the command for closing until the shutter is fully closed are substantially constant.

On the other hand, the commands for opening and closing of the shutter can be effected at any timing.

Accordingly, the exposure controlling part 22 determines the timing of the opening command time TA so that a laser pulse is output at time t=TC, and determines the timing of the closing command time TD so that a laser pulses is output at time t=TE. Thus, the pulse number $n_1$ of the laser during the period from the start of the shutter opening operation until the opening operation is terminated and the pulse number $n_2$ of the laser during the period from the start of the shutter closing operation until the closing operation is terminated are predetermined values.

Now, the exposure energy amount entering the photoresist layer on the wafer W from the start of the exposure till the termination of the exposure is proportional to the integrated energy amount passed through the shutter 14. Accordingly, if the integrated energy amount passing through the shutter 14 is controlled, the exposure amount for the photoresist layer on the wafer W can be controlled.

First, the exposure controlling part 22, as described above, receives the exposure amount signal Sdose as an input (see the step 100 of FIG. 4), and determines the integrated energy amount Edose passing through the shutter 14 for obtaining a proper exposure amount, on the basis of the exposure amount signal $S_{dose}$.

When the exposure amount $S_{dose}$, or in other words, the integrated energy amount $E_{dose}$, is given, the following calculation is effected in the exposure controlling part 22 and the energy amount Eo per laser pulse and the whole exposure pulse number are determined (see step 102).

More particularly, when in FIG. 3,
the pulse number till $TB < t \leq TC$ is $n_1$
the pulse number till $TC < t \leq TE$ is $n_2$
the pulse number till $TE < t < TF$ is $n_3$, $n_1$ and $n_3$ are predetermined values and therefore, the pulse number determined at this step is $n_2$.

First, the pulse repetition interval TP is determined under conditions for which it is stable in each pulse and more than necessary energy is obtained, and is fixed.

The inclinations during the opening operation and during the closing operation are constant and therefore, with $r_1$, $r_2$, a and b as constants, the integrated energy $E_1$ at $TB < t \leq TC$ is $$E_1 = \sum_{i=1}^{n_1} E_0 \cdot r_1 \cdot \tau + a, \quad (1)$$

the integrated energy $E_2$ at $TC < t \leq TE$ is $$E_2 = N_2 E_0 \quad \ldots (2)$$

and the integrated energy $E_3$ at $TE < t < TF$ is $$E_3 = \sum_{i=1}^{n_3} E_0 \cdot r_2 \cdot \tau + b. \quad (3)$$

Consequently, $$E_{dose} = E_1 + E_2 + E_3 \quad (4)$$
$$= E_0 \left\{ \sum_{i=1}^{n_1} r_1 \cdot \tau + n_2 + \sum_{i=1}^{n_3} r_2 \cdot \tau \right\} + a + b.$$

In this equation (4), $$E_{dose}, \sum_{i=1}^{n_1} r_1 \cdot \tau, \sum_{i=1}^{n_3} r_2 \cdot \tau,$$

a and b are all known values. Accordingly, if equation (4) is developed, it becomes the following equation (5):

$$n_2 = \frac{E_{dose} - a - b}{E_0} - \sum_{i=1}^{n_1} r_1 \cdot \tau - \sum_{i=1}^{n_3} r_2 \cdot \tau \quad (5)$$

Here, when the maximum value $E_{Omax}$ allowed by the capability of the laser source 10 is used as the energy amount $E_0$ per pulse, $n_2$ is shown by the following equation (6). However, it is to be understood that $n_2$ must be an integer and $G[x]$ shows the greatest integer less than x.

$$n_2 = G \left[ \frac{E_{dose} - a - b}{E_{Omax}} - \sum_{i=1}^{n_1} r_1 \cdot \tau - \sum_{i=1}^{n_3} r_2 \cdot \tau \right] \quad (6)$$

and by this, $n_2$ is determined.

When $n_2$ obtained from equation (6) in the manner described above is used and it is substituted in equation (4) above, $$E_0 = \frac{E_{dose} - a - b}{\sum_{i=1}^{n_1} r_1 \cdot \tau + n_2 + \sum_{i=1}^{n_3} r_2 \cdot \tau}, \quad (7)$$

whereby $E_0$ is determined.

In conformity with the energy amount $E_0$ per pulse determined in the manner described above, the energy command signal Se is output from the exposure controlling part 22 to the laser source 10, and control of the output light amount of the laser source is effected in conformity with the output level of the signal Se (see step 104).

The outputting of a pulse signal Sn is controlled in conformity with the pulse number $n_2$ determined in the manner described above.

Then, in the exposure controlling part 22, the time tc is calculated from the interval TP prestored in the internal memory and the aforementioned calculated pulse number $n_2$, and the time TD of the command for closing is calculated on the basis of the opening-closing operation times ta, tb, td and te of the shutter 14 pre-stored in the internal memory (see step 106). The time TA of the command for opening is suitably predetermined relative to the timing of the pulse output of the laser source 10.

More particularly, since the pulse repetition interval TP is determined in the manner described above, the length of the time tc can be found by means of the values of the pulse number $n_2$ and the pulse repetition interval TP.

Since at time TC, pulse outputting must be effected without fail, the exposure controlling part 22 calculates the difference between the timing TA of the command for opening and the output timing of the light emission trigger signal St by the use of the known time tb. By the calculated difference, the exposure controlling part 22 responds to the pulse corresponding to the light emission trigger signal St, and the signal Ss indicative of the command for opening is output to the shutter driver 16 and the time count by an interval timer is started (see step 108) and thus, the opening operation of the shutter 14 is started.

Until this point of time, the exposure controlling part 22 inhibits the generation of the signal ST by an internal gate circuit therein. The exposure controlling part 22 permits the gate circuit to output the light emission trigger signal St to the laser source 10 after the shutter 14 has started the opening operation (step 110).

The laser pulse passed through the shutter 14 is transmitted through the second illumination optical system 18 and enters the reticle R, and the exposure of the circuit pattern of the reticle R to the wafer W is effected.

Judgment as to whether the time counted by the internal timer has become the time (tb+tc−td) of the command for closing the shutter 14 is done while the exposure operation as described above continues (see step 112). After the termination of the time count, the signal Ss indicative of the command for closing is output by the exposure controlling part 22 (see step 114).

More particularly, when the sum of the known time tb and said time tc, minus the known time td, has elapsed after the command for opening, the command for closing of the shutter 14 is effected.

The closing operation of the shutter 14 is performed on the basis of this command and the exposure to the wafer W is terminated.

In the above-described embodiment, the light emission trigger signal St, if it is output always at a predetermined time interval, is preferable in that the energy of each output pulse of the laser source 10 is easily stabilized.

However, if the laser source 10 is continuedly caused to emit light when the exposure of the reticle R is not effected, there is the inconvenience that the life of the laser source 10, particularly, the parts thereof, is shortened.

Therefore, it is better to effect the outputting of the light emission trigger signal St so that the light emitting operation of the laser source 10 is performed only when the exposure is effected or from a little before the laser beam is applied.

Also, if the light emission is started at a predetermined time interval from a state in which the light emission of the laser source 10 is not effected at all, the light amount of the initial output pulse will sometimes become greater than the target value and therefore, it is better to start the light emission from a little before the start of the exposure.

However, where as in the present embodiment, the shutter 14 is gradually opened and the transmission factor gradually becomes greater, it is sometimes unnecessary and in such case, it is not necessary to effect the light emission from a little before the start of the exposure.

As described above, according to the present embodiment, the opening operation of the shutter 14 is performed at predetermined timing irrespective of the proper exposure amount and the relation between the timing of the closing operation of the shutter 14 and the timing of the light emission output of the laser source 10 and the light amount of each pulse of the laser source 10 are controlled so that the proper exposure amount required by the wafer W is obtained and therefore, the occurrence of fluctuation or irregularity of the exposure energy in each exposure step can be prevented well.

Also, even a case where the proper exposure amount differs slightly between the objects to be exposed in spite of the pulse laser being used can be coped with well.

Further, in addition to the control of the laser light emission in the laser source 10, the control of the laser output is effected with the shutter 14 being provided, and this also leads to the advantage that the unnecessary laser output is not effected even when malfunctioning of the laser light emission trigger system occurs.

The present invention is not restricted to the above-described embodiment, but is of course also applicable, for example, to an illuminating device using any other pulse light source than the excimer laser.

Also, in the above-described embodiment, the energy amount per pulse is controlled by directly controlling the laser source. In the case of the excimer laser, the discharge voltage can be controlled to thereby control the energy amount per pulse.

However, in such control, the energy amount per pulse sometimes becomes unstable, and when it is necessary to effect such control frequently, a mode in which attenuation and regulation is effected outside the light source by a light attenuator or the like is more advantageous because the stability of the energy between pulses is good.

Also, in the above-described embodiment, the transmission type shutter has been used, but alternatively, a reflection type shutter may be used. In such case, the opening-closing operation of the shutter and the application of pulse are in a converse relation. That is, when the pulse is reflected and applied to the object and the shutter is opened, the pulse is transmitted through the shutter and is no longer applied to the object. The present invention also covers such a case, and means for closing the optical path of the light pulse for the object may be of any mode.

Further, while the above-described embodiment is one in which the present invention is applied to an exposure apparatus, this is not restrictive, and the present invention is also applicable to other apparatuses.

Now, the energy of the laser beam ought to be controlled constantly by the signal Se from the exposure controlling part 22, but actually, for the reason as previously set forth, there is irregularity of the order of several per cent in the actual energy although the output period of each pulse is substantially constant.

Figure 5:
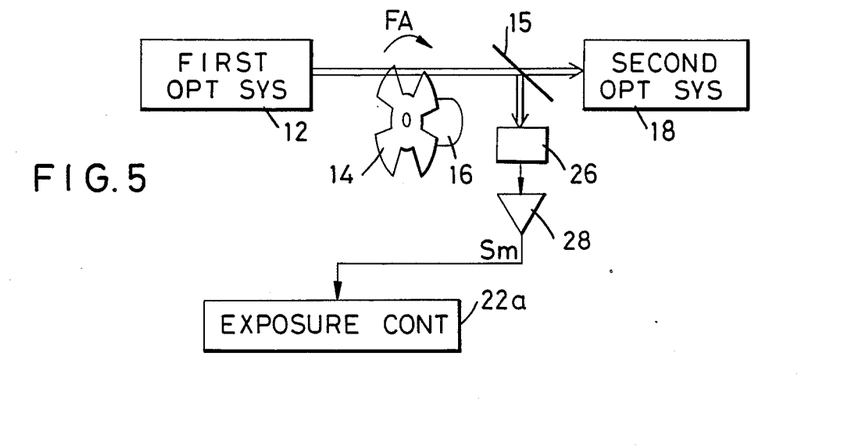
FIG. 5 is a block diagram showing an improved embodiment of the present invention.

FIG. 5 shows an improved embodiment of the present invention for enabling a proper exposure amount to be obtained even for the irregularity of the energy of the laser beam. The laser source 10, the reticle R, the optical system 20, the wafer W, the stage 13 and the signals Se, St and Ss are omitted in FIG. 5. The detection output side of a detector 26 for detecting the intensity of a partial laser beam divided by a beam splitter 15 is connected to an exposure controlling part 22a through an amplifier 28. The exposure controlling part 22a somewhat differs in construction from the exposure controlling part 22 of FIG. 2.

Figure 6:
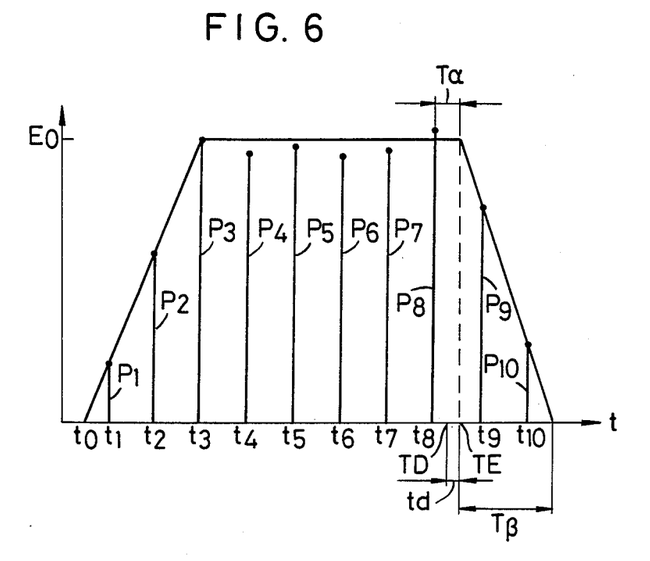
FIG. 6 is a graph showing an example of pulses transmitted through the shutter.

In FIG. 6, there is shown an example of the laser pulses transmitted through the shutter 14. Output pulses $P_1$, $P_2$, $P_3$, ... from the laser source 10 are controlled so as to become constant energy, and are output at $t = t_1, t_2, t_3, \ldots$ at a predetermined period.

Actually, however, the energy E is irregular for each pulse and generally assumes a value different from the average value $E_0$ although the period is accurately kept at a constant value.

Figure 7:
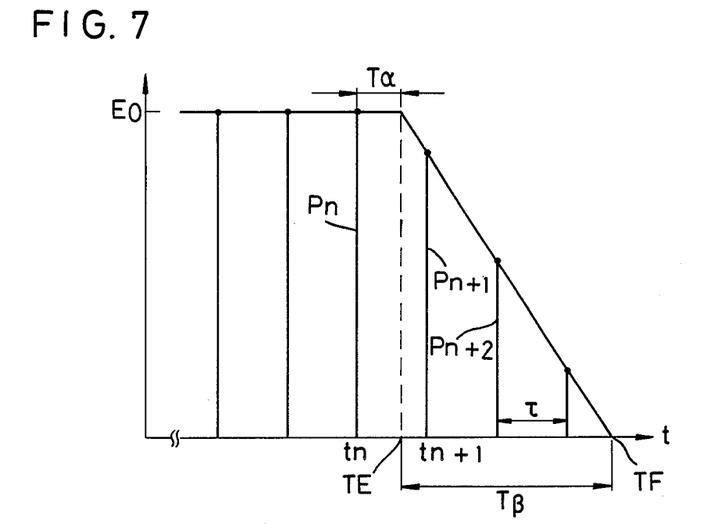
FIGS. 7, 8 and 9 illustrate the relation between the shutter closing operation starting timing and the transmitted energy.

As shown in FIG. 7 which enlargedly shows a portion of FIG. 6, the time $T\beta$ of the falling portion during which the closing operation of the shutter 14 is performed (the time from when the shutter 14 begins to actually intercept the laser beam until the interception of the laser beam is completed) is predetermined to integer times the pulse repetition period $\tau$.

A description will now be given of the relation between the starting time TE of the closing operation of the shutter 14 and the timing of the pulse output. It is to be noted that the time from the nth (n=8 in FIG. 6) pulse until the shutter 14 begins to be closed is $T\alpha$. Also, the total integrated energy from the starting time of the opening operation of the shutter 14 until the nth pulse is $E_{nsum}$. Further, in the ensuing description the energy amount of each pulse is assumed as e.

Figure 8:
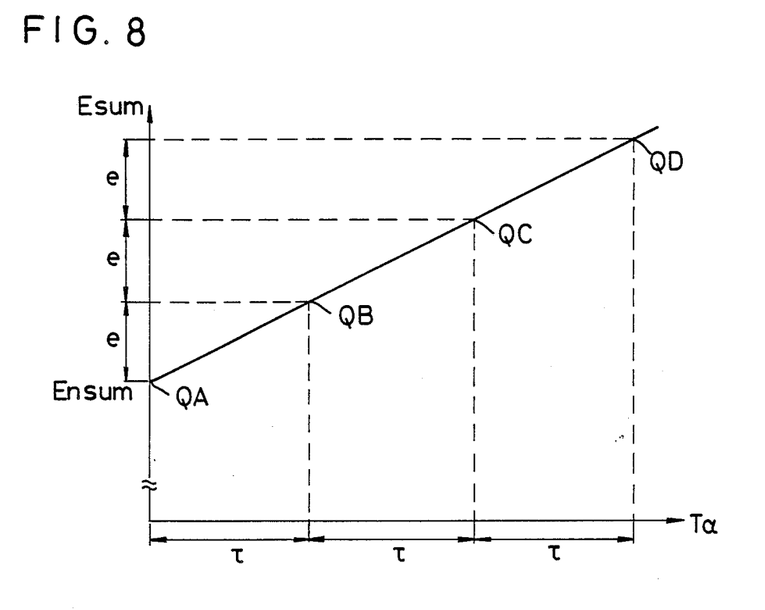

In FIG. 7, if $T\alpha$ is varied by an amount corresponding to the pulse period $\tau$ from the time tn when the nth pulse Pn is generated, the total integrated energy $E_{sum}$ passing through the shutter 14 changes from QA of FIG. 8 (the point of the total integrated energy $E_{nsum}$ up to the nth pulse) to QB which is greater by the energy e.

Figure 9:
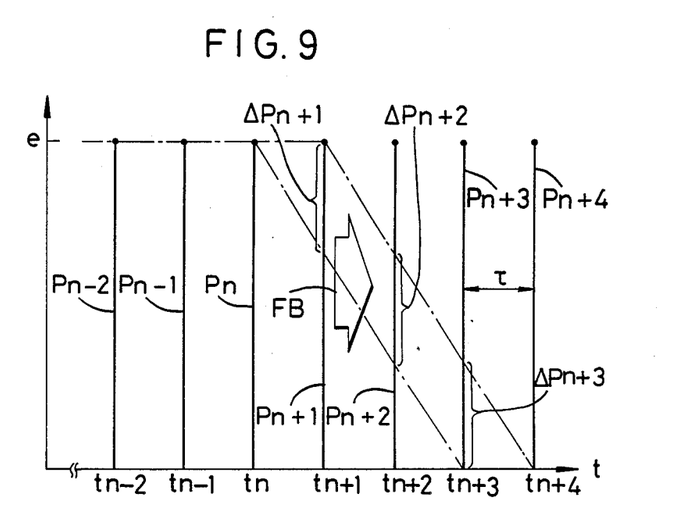

More particularly, as shown in FIG. 9, the change in $T\alpha$ corresponds to the movement of the falling portion in the direction of arrow FB. If $T\alpha$ is less than TP, the energy amount of the sum of pulse changes $\Delta P_{n+1}$, $\Delta P_{n+2}$ and $\Delta P_{n+3}$ is varied by an amount e corresponding to the maximum one pulse, by the movement of $T\alpha$. This is because the closing operation time $T\beta$ of the shutter 14 is determined to integer times the pulse output period $\tau$ and the period $\tau$ is constant. This $\tau$ corresponds to the aforementioned TP. To make this possible, the shutter driver includes a pulse motor, and the exposure controlling part 22a predetermines the period of the pulse which drives the pulse motor so that the closing operation time $T\beta$ is integer times the period $\tau$.

Further, if $T\alpha$ is varied beyond $\tau$, the total integrated energy $E_{sum}$ varies in proportion the time $T\alpha$, as shown at points QB, QC, QD, ... in FIG. 8.

As is apparent from the reference to FIG. 8, if $T\alpha$ is varied, it becomes possible to vary the total integrated energy $E_{sum}$, and if the pulse energy is of a constant value e, $E_{sum}$ varies for $T\alpha$ without its range being linearly limited. The inclination of this straight line is $e/\tau$.

If the number of pulses present within the closing operation time of the shutter 14, i.e., the time $T\beta$ of the falling portion, is m, the minimum possible integrated energy $E\beta_0$ in this portion is $$E\beta_0 = \sum_{i=1}^{m} Pn + i. \tag{8}$$

This $E\beta$ can be calculated from the value of the pulse energy e, the value of the period $\tau$, the time $T\alpha$ from the nth pulse shown in FIG. 7 until the shutter 14 begins to be closed and the falling time $T\beta$.

As described above, in this embodiment, the closing operation starting time of the shutter 14 is controlled to thereby adjust the total integrated energy amount.

Figure 10:
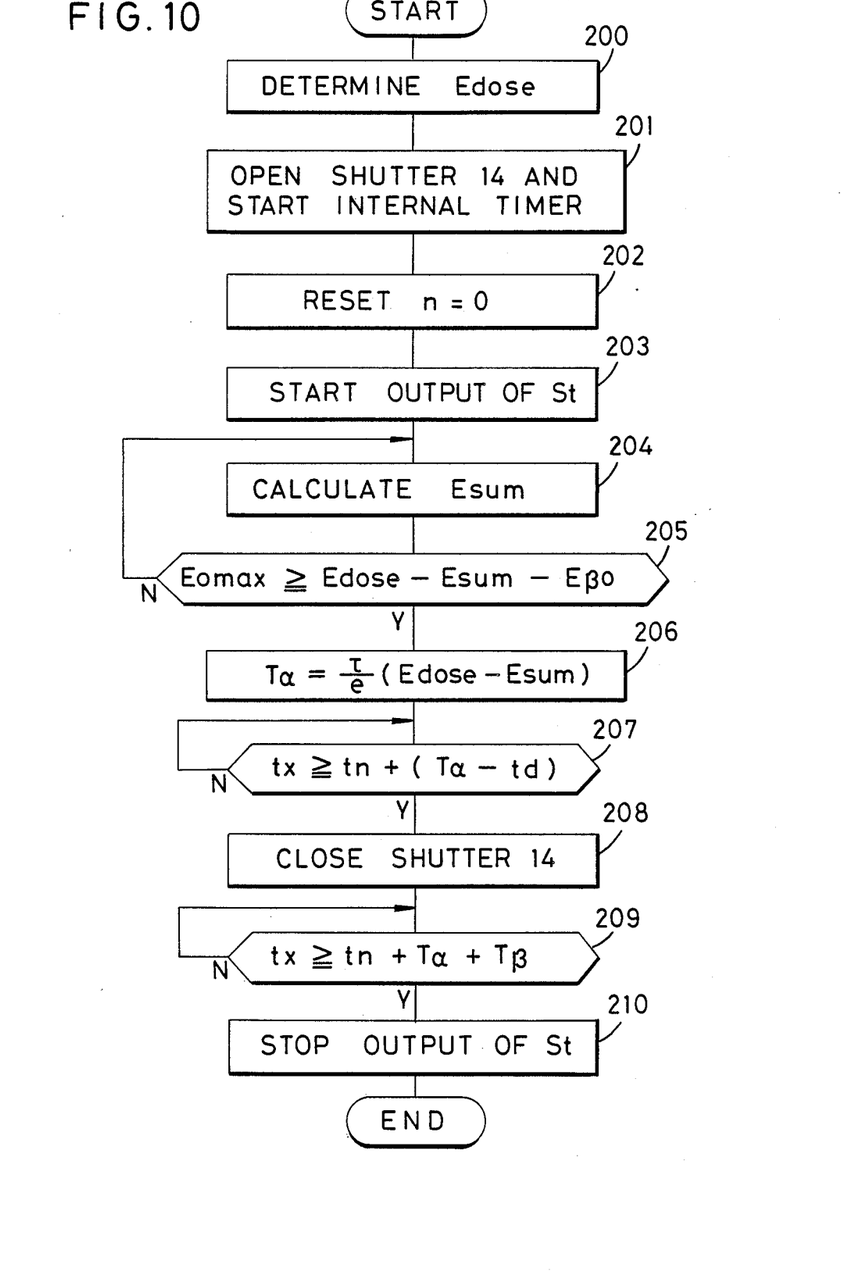
FIG. 10 is a flow chart showing the operation of the improved embodiment of the present invention.

The operation of the apparatus of FIG. 5 will now be described with reference to the flow chart of FIG. 10.

Figure 4:
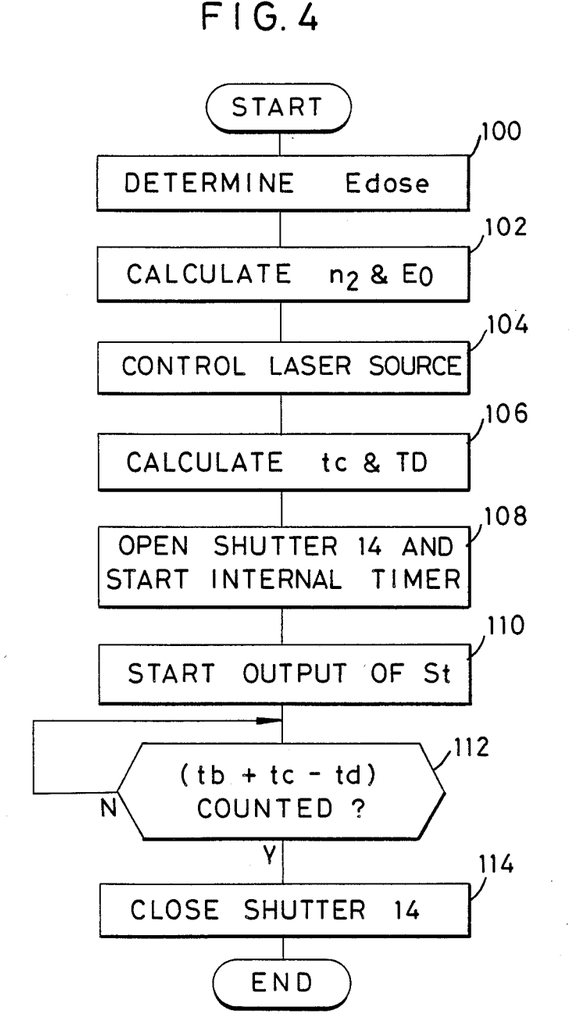
FIG. 4 is a flow chart showing the operation of the embodiment of FIG. 2.

First, as at the step 100 of FIG. 4, the proper exposure amount Edose is determined (see step 200).

Then, the command for opening the shutter 14 is output as a signal Ss from the exposure controlling part 22a to the shutter driver 16 and at the same time, the internal timer is caused to count time (see step 201).

Then, resetting of the internal counter which counts the pulse number corresponding to the signal St is effected in the exposure controlling part 22a and the content n of the internal counter is set to n=0 (see step 202). The light emission trigger signal St is output from the exposure controlling part 22a to the laser source 10, whereby the laser source 10 emits light at a predetermined period $\tau$ and the outputting of the laser pulses is started (see step 203).

When the opening operation of the shutter 14 is then started, the laser pulses pass through the shutter 14 as shown in FIG. 6. On the one hand, these laser pulses are applied onto the wafer W to accomplish exposure and on the other hand, they are converted into the integrated energy $E_{sum}$ by the exposure controlling part 22a from an amplifier 28 responding to the light having entered the detector 26 through the beam splitter 15 (see step 204).

If the proper integrated energy determined at step 200 is $E_{dose}$, whether $E_{dose}$ has become $$E_{Omax} > E_{dose} - (E_{sum} + E\beta_0) \ldots \tag{9}$$

for the passed energy $E\beta$ during the closing operation of the shutter 14 (which is found in advance by calculation) is judged. The deficient light amount El estimated at the point of time of this judgment is indicated as $El = E_{dose} - (E_{sum} + E\beta_0)$, and whether El is sufficiently greater than the estimated maximum light amount $E_{Omax}$ of the laser beam of one pulse is judged (see step 205).

When expression (9) is not satisfied as a result of this judgment, return is made to step 204 (see step 206). Similar processing is repetitively effected for the next laser pulse.

When expression (9) is satisfied as a result of such judgment, the time $T\alpha$ from the point of time at which this laser pulse is generated until the shutter 14 begins to be closed is calculated from the following equation (10) by the exposure controlling part 22a on the basis of FIG. 8 (see step 206). That is, the time $T\alpha$ necessary to make up for the deficient light amount El is found. To accomplish the most accurate control, it is necessary to set the nth pulse shown in FIG. 7 (set the pulse which provides the starting point of $T\alpha$) so that $T\alpha$ is $T\alpha < \tau$.

$$T\alpha = \frac{\tau}{e} (E_{dose} - E_{sum}) \tag{10}$$

Subsequently, the following time count is effected and the closing command time of the shutter 14 is found by the exposure control part 22a. That is, for the time tx counted by the internal timer, whether $$tx > tn + (T\alpha - td) \ldots \tag{11}$$

is judged, and the time count is effected until this condition is satisfied (see step 207).

In expression (11), td is the delay time from when the command for closing is effected until the shutter 14 actually begins to be closed, and tn is the time of the laser pulse which satisfies expression (9) above.

Then, after the lapse of the abovementioned time, a command for closing the shutter is output, i.e., a shutter opening-closing signal Ss from the exposure controlling part 22a to the shutter driver 16 (see step 208).

The time count is then effected until $$tx > tn + T\alpha + T\beta \ldots \tag{12}$$

(see step 209). tn is calculated as $tn = n \cdot \tau - c$ in conformity with the content of the internal counter, and c is a constant indicated by $\tau - (t_1 - t_0)$. This operation is for measuring the time until the shutter 14 becomes fully closed.

When this time count is terminated, the outputting of the light emission trigger signal St to the laser source 10 is terminated and the emission of the laser pulses is stopped (see step 210. By the above-described operation, the necessary amount of exposure to the wafer W is terminated.

The state of the shutter 14 may be a still fully closed state or an opened state.

If the outputting of the laser pulses is not stopped at step 210, the operation of step 207 will be unnecessary, but when the exposure is not effected, it is better that the light emission of the laser source 10 is not effected, because the lives of the constituent parts of the laser source 10 become longer.

Further, in the above described improved embodiment, the beam splitter 15 is disposed rearwardly of the shutter 14 so that the energy after passing through the shutter is monitored, but the time widths of the rising portion and falling portion required for the opening-closing operation of the shutter 14 and the time delay of the shutter 14 relative to the operation command are constant and can be pre-measured, as described above.

Accordingly, even if the beam splitter 15 is disposed forwardly of the shutter 14 so that the pulse energy before passing through the shutter 14 is monitored, a similar effect can be obtained, or an energy monitor may be provided in the laser source 10 so as to monitor the output thereof.

In the above-described improved embodiment, the energy of each individual laser pulse has been measured (integrated), but when the degree of irregularity or fluctuation of the energy amount is low, the closing operation period of the shutter 14, i.e., the time $T\beta$ of the falling portion, is integer times the pulse period $\tau$ and therefore, if the timing of the start of the opening operation of the shutter is always in a predetermined relation with the timing of the pulse output, the exposure can be controlled to a proper exposure amount by only the control of the time during which the shutter 14 is fully opened.

In such case, the beam splitter 18, the detector 26 and the amplifier 28 are unnecessary and it will suffice if laser pulses always controlled to a predetermined light amount are output from the laser source 10.

That is, on the basis of the necessary exposure amount designated by the input exposure amount signal $S_{dose}$ and the energy amount of the laser pulses output from the laser source, the exposure controlling part calculates the relation between the output timing of the laser pulses and the timing of the start of the opening operation of the shutter and the time during which the shutter is fully opened, and outputs the light emission trigger signal St and the shutter opening-closing signal Ss on the basis thereof.

When such time control is effected, it is necessary to find in advance not only the substantial closing operation period of the shutter but also the light amount only during the opening operation period, but this will be unnecessary if the closing operation period and the opening operation period are the same.

Further, a laser source such as an excimer laser is not always stable in the energy amount per pulse at the start of the light emission, and is more stable in the energy amount when a light emission trigger signal is input thereto at a predetermined interval. On the other hand, the apparatus has a limited life (deterioration of the internal gas, etc.) and if viewed from this angle, unnecessary light emission should be avoided.

A further improved embodiment of the present invention will now be described.

A study will be made of energy $E\beta$ passing through the shutter 14 when the closing operation time width $(td+T\beta)$ varies.

Figure 11:
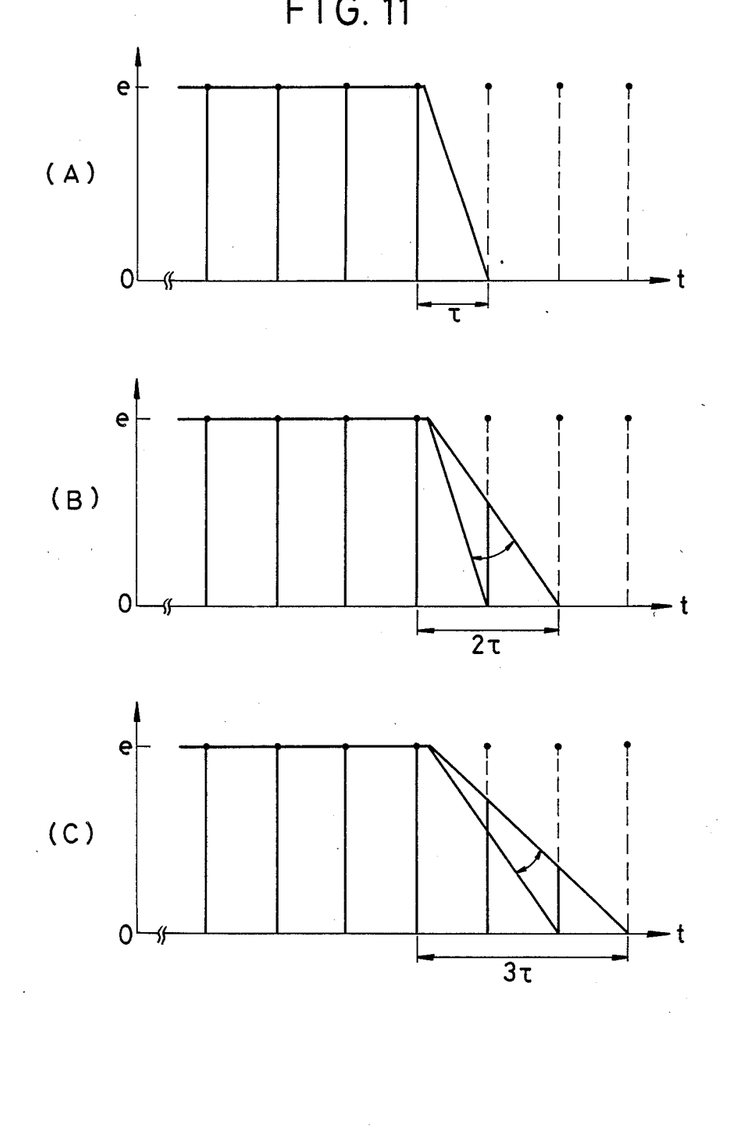

First, when $0 \leq td+T\beta < \tau$, as shown in FIG. 11 (A), the energy $E\beta$ is $$E\beta = 0.$$

Next, when $\tau \leq td+T\beta < 2\tau$, as shown in FIG. 11 (B), the energy $E\beta$ is $$E\beta = e\left(1 + \frac{td}{T\beta} - \frac{\tau}{T\beta}\right). \tag{14}$$

When $2\tau \leq td+T\beta < 3\tau$, as shown in FIG. 11 (C), the energy $E\beta$ is $$E\beta = e\left\{2\left(1 + \frac{td}{t\beta}\right) - 3\frac{\tau}{T\beta}\right\}. \tag{15}$$

Generally, when $n\tau \leq td+T\beta < (n+1)\tau$, the energy $E\beta$ is $$E\beta = e\left\{n\left(1 + \frac{td}{T\beta}\right) - \frac{n(n+1)\tau}{2T\beta}\right\}. \tag{16}$$

Figure 12:
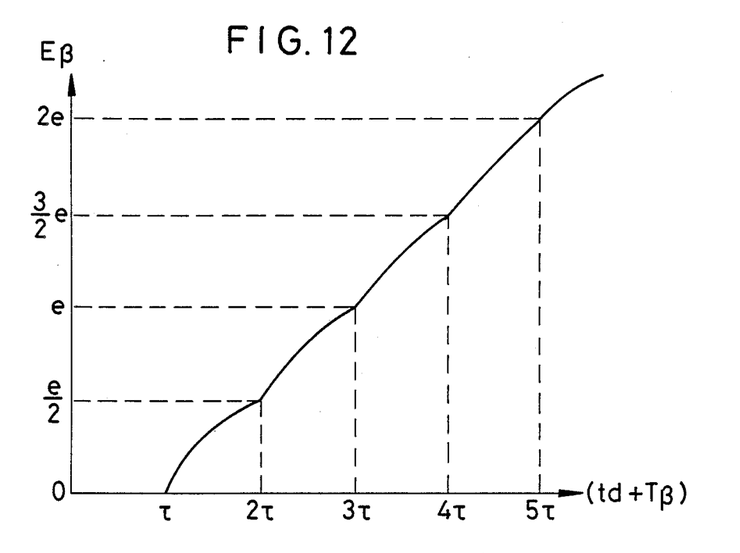

The relation between the closing operation time width $(td+T\beta)$ as described above and the passed energy $E\beta$ during that time is graphically shown in FIG. 12.

As shown in this figure, $E\beta$ exhibits a different curve function each time the closing operation time width $(td+T\beta)$ varies by the pulse period $\tau$, but when the closing operation time width is continuous at $0 \leq (td+T\beta)$ and $\tau \leq (td+T\beta)$, $E\beta$ increases monotonously.

Of said delay time td, the portion concerned with the operation speed of the mechanical system and the falling time $T\beta$ can be made variable by controlling the operation speed of the shutter 14.

Also, as regards the average energy amount e per pulse, the value thereof can be used as a constant by effecting the control of constant output always on the laser source 10 side, or the energy monitor amount from the detector 26 can also be averagely found.

Accordingly, if the necessary energy $E\beta$ is given, the closing operation time width $(td+T\beta)$ can be primarily determined from the graph of FIG. 12. That is, if within a variably controllable range of the closing operation time width $(td+T\beta)$, the energy amount passed through the shutter in the meantime can be varied by controlling the speed of the shutter 14. This variable passed energy amount is indicated by thick solid line in FIG. 11.

Specifically, if the variable range of the closing operation time width $(td+T\beta)$ is predetermined and the range of the passed energy $E\beta$ corresponding to this range is $E\beta \leq E\beta_1$, the closing operation of the shutter 14 may be started in synchronism with the pulse when relative to the designated necessary exposure energy $E_{dose}$, the integrated exposure energy $E_{sum}$ actually measured in the opened state of the shutter 14 is within the range of $$E_{dose} - E\beta_1 \leq E_{sum}\cdots \tag{17}$$

and the then closing operation time width $(td+t\beta)$ of the shutter 14 may be set by means of FIG. 12 so as to correspond to $$E\beta = E_{dose} - E_{sum}\cdots \tag{18}$$

Figure 13:
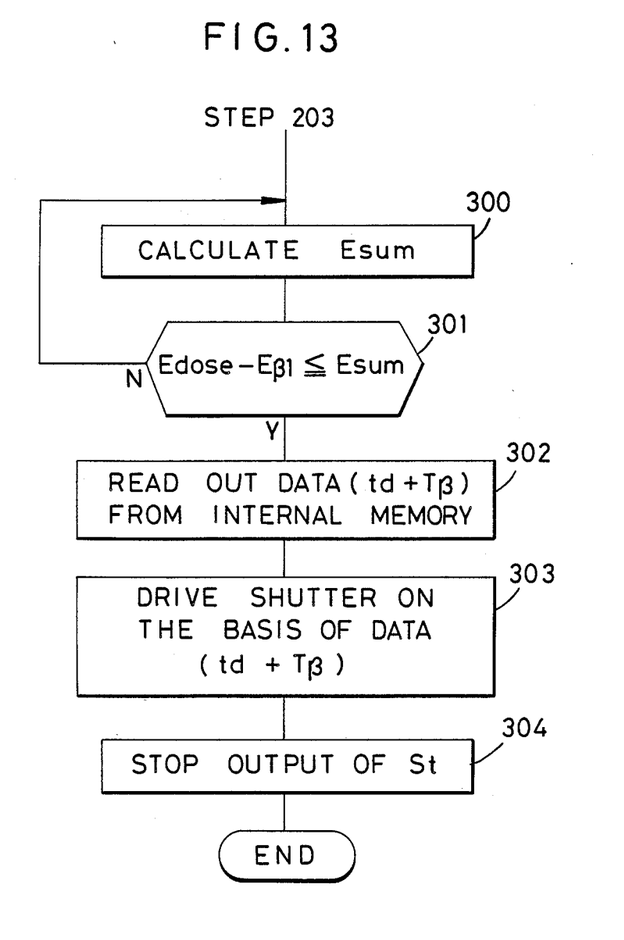
FIG. 13 is a flow chart showing the operation of the further improved embodiment of the present invention.

The operation of the apparatus will now be described with reference to the flow chart of FIG. 13. Up to step 203 are similar to the operation shown in FIG. 10.

When the opening operation of the shutter 14 is then started, the laser pulses pass through the shutter 14 as shown in FIG. 6. At step 300, processing similar to step 204 is effected.

Assuming here that the proper exposure energy is $E_{dose}$ whether the above-mentioned set value $E\beta_1$ has become $E_{dose} - E\beta_1 \leq E_{sum}$ as shown in expression (17) is judged (see step 301).

When expression (17) is not satisfied as a result of this judgment, the above-mentioned pulse count value n is rendered into n+1 and return is made to step 300. Similar processing is then repeated for the next laser pulse.

Also, when expression (17) is satisfied as a result of such judgment, the closing operation of the shutter 14 is started in synchronism with the pulse when such condition is satisfied and at the same time, the then closing operation time width $(td+T\beta)$ of the shutter 14 is determined so as to correspond to $$E\beta = E_{dose} - E_{sum}\cdots \tag{18}$$

More specifically, the value of (td+Tβ) for Eβ shown in FIG. 12 is stored in the internal memory of the exposure controlling part 22a, and at step 302, the value of (td+Tβ) for Eβ which satisfies equation (18) is read out from the internal memory. Where the motor for driving the shutter 14 is a pulse motor, the exposure controlling part 22a supplies the motor with a pulse of a frequency corresponding to the determined (td+Tβ) (see step 303).

Then, after the closing operation of the shutter 14 based on such command, the outputting of the light emission trigger signal St to the laser source 10 is terminated and the emission of the laser pulses is stopped (see step 304). By the above-described operation, the necessary amount of exposure to the wafer W is terminated.

Further, in the above-described embodiment, the beam splitter 18 is disposed rearwardly of the shutter 14 so that the energy after passing through the shutter is monitored, but a similar effect may be obtained even if the beam splitter 18 is disposed forwardly of the shutter 14 so that the energy before passing through the shutter 14 is monitored, or an energy monitor may be provided in the laser source 10 so as to monitor the output thereof.

As described above, according to the present embodiment, the energy amount passed through the opened shutter, including the irregularity of the energy amount of each pulse, is integratedly detected by detecting means, and this value is compared with the commanded necessary exposure energy and the shutter closing operation time width or the operation speed is determined, whereby adjustment of the exposure energy amount is effected, and this leads to the effect that the error in the exposure amount resulting from the fluctuation of the energy of each pulse is modified well.

Also, in the present embodiment, the energy amount of each pulse is measured and therefore, adjustment of the light amount can be accomplished well even if the pulse output of the laser source is effected after, for example, the shutter has become fully open.

I claim:

1. An apparatus including:
   (a) applying means for applying radiation repetitively to an object;
   (b) shutter means disposed in the optical path from said applying means to said object, said shutter means having a first state in which said applying means is inhibited from applying the radiation to the object and a second state in which said applying means is permitted to apply the radiation to the object; and
   (c) control means for controlling said applying means and said shutter means so that said applying means applies the radiation repetitively to the object during the period from when said shutter means starts the shift from said first state to said second state until said shutter means completes the shift from said second state to said first state, said control means having first calculating means for calculating the amount of radiation applied once by said applying means, prior to the start of the operation of said shutter means by said control means, so that the object obtains a proper exposure amount by the radiation, and second calculating means for calculating the time when said shutter means shifts from said second state to said first state, prior to the start of the operation of said shutter means by said control means, said control means causing said applying means to apply the radiation for a predetermined period on the basis of the amount of radiation calculated by said first calculating means, and wherein said control means controls said shutter means so that the point of time at which said shutter means has substantially completed the shift from said first state to said second state and the point of time at which said shutter means starts the shift from said second state to said first state are substantially coincident with points of time at which said applying means applies the radiation.

2. An apparatus according to claim 1, wherein said first calculating means calculates, on the basis of the proper exposure amount, the frequency with which said applying means applies the radiation during the period from the point of time at which said shutter means has substantially completed the shift from said first state to said second state until the point of time at which said shutter means starts the shift from said second state to said first state, and calculates the amount of radiation on the basis of said calculated frequency.

3. An apparatus including:
   (a) applying means for applying radiation repetively to an object;
   (b) shutter means disposed in the optical path from said applying means to said object, said shutter means having a first state in which said applying means is inhibited from applying the radiation to the object and a second state in which said applying means is permitted to apply the radiation to the object; and
   (c) control means for controlling said applying means and said shutter means so that said applying means applies the radiation repetively to the object at a predetermined period during the period from when said shutter means starts the shift from said first state to said second state until said shutter means completes the shift from said second state to said first state, said control means being effective to control said shutter means so that the period from when said shutter means starts the shift from said second state to said first state until said shutter means completes said shift is substantially integer times said predetermined period.

4. An apparatus according to claim 3, further including means for producing an integrated signal conforming to the integrated amount of radiation applied from said applying means to the object through said shutter means and wherein said control means has detecting means for detecting that the proper exposure amount of the object minus a predetermined amount and the amount indicated by said integrated signal have assumed a predetermined relation and outputting a detection signal, and determining means for determining the time when said shutter means starts the shift from said second state to said first state, in response to said detection signal.

5. An apparatus according to claim 4, wherein said determining means has means for calculating the time from the time when said applying means has applied the radiation last during the period from when said shutter means starts the shift from said first state to said second state until said detection signal is produced till the time when said shutter means starts the shift from said second state to said first state, and said control means controls said shutter means on the basis of the time calculated by said calculating means.

6. An apparatus according to claim 5, wherein said predetermined amount substantially coincides with the sum of the integrated amount of radiation applied to the object during the period in during which said shutter means shifts from said second state to said first state and the amount of radiation applied once to the object by said applying means, and said detecting means detects that the proper exposure amount of the object minus said predetermined amount has become substantially coincident with the amount indicated by said integrated signal and outputs said detection signal.

7. An apparatus including:
   (a) applying means for applying radiation to an object;
   (b) shutter means disposed in the optical path from said applying means to said object, said shutter means having a first state in which said applying means is inhibited from applying the radiation to the object and a second state in which said applying means is permitted to apply the radiation to the object;
   (c) means for producing an integrated signal conforming to the integrated amount of radiation applied from said applying means to the object through said shutter means from when said shutter means starts the shift from said first state to said second state; and
   (d) control means for controlling said applying means and said shutter means so that said applying means applies the radiation to the object a plurality of times during the period from when said shutter means starts the shift from said first state to said second state until said shutter means completes the shift from said second state to said first state, said control means having detecting means for detecting that the difference between the proper exposure amount of the object and the amount indicated by said integrated signal has assumed a predetermined relation and outputting a detection signal, and determining means responsive to said detection signal to determine the speed of the shift of said shutter means from said second state to said first state for the object to obtain the proper exposure amount.

8. An apparatus according to claim 7, wherein said determining means has memory means storing therein data indicative of a plurality of speeds for the shift of said shutter means from said second state to said first state, and means for reading out the data in said memory means which corresponds to one of said plurality of speeds on the basis of the difference between the proper exposure amount of the object when said detection signal is output and the amount indicated by said integrated signal, and said control means controls the speed of the shift of said shutter means from said second state to said first state on the basis of the data read out from said memory means.

9. An apparatus including:
   (a) applying means for applying radiation to an object;
   (b) shutter means disposed in the optical path from said applying means to said object, said shutter means having a first state in which said applying means is inhibited from applying the radiation to the object and a second state in which said applying means is permitted to apply the radiation to the object; and
   (c) control means for controlling said applying means and said shutter means so that said applying means applies the radiation to the object a plurality of times during the period from when said shutter means starts the shift from said first state to said second state until said shutter means completes the shift from said second state to said first state, said control means being effective to control the speed of the shift of said shutter means from said second state to said first state so that the object obtains a proper exposure amount by the radiation.

10. An apparatus according to claim 1, wherein said applying means has a laser source, and wherein said applying means applies the radiation from said laser source to the object.

11. An exposing apparatus for forming an image of a mask on a semiconductor substrate to expose said semiconductor substrate, comprising:
   (a) applying means provided with a laser source for applying repetitive pulses of radiation from said laser source to said mask;
   (b) shutter means disposed in the optical path from said applying means to said mask, said shutter means having a first state in which said applying means is inhibited from applying the radiation to said mask and a second state in which said applying means is permitted to apply the radiation to said mask; and
   (c) control means for controlling said applying means and said shutter means so that said applying means applies a plurality of pulses of the radiation to said mask at a predetermined repetitive period during the period from when said shutter means starts the shift from said first state to said second state until said shutter means completes the shift from said second state to said first state, said control means being effective to control said shutter means so that the period from when said shutter means starts the shift from said second state to said first state until said shutter means completes said shift is substantially integer times said predetermined repetition period.

12. Apparatus for irradiating an object, comprising a source of repetitive radiation pulses, shutter means, shiftable between a first state and a second state, for exposing said object to a plurality of said pulses during said second state and for preventing exposure of said object to said radiation during said first state, and a control system including means for controlling at least one of the energy and repetition rate of said pulses, means for controlling the duration of said second state, and means for synchronizing the beginning and end of said second state with respective radiation pulses.

13. Apparatus in accordance with claim 12, wherein said means for controlling at least one of the energy and repetition rate of said pulses sets the repetition rate at a constant value and adjusts the energy of said pulses so that said object is exposed to a desired dose of radiation dependent upon the duration of said second state.

14. Apparatus in accordance with claim 12, wherein said means for controlling the duration of said second state adjusts the duration of said second state dependent upon the energy of said pulses so as to expose said object to a desired dose of radiation.

15. Apparatus for irradiating an object, comprising a source of repetitive radiation pulses, shutter means, shiftable between a first state and a second state, for exposing said object to a plurality of said pulses during said second state and for preventing exposure of said object to said radiation during said first state, and a control system including means for detecting the energy of said pulses and means responsive to said detecting means for controlling the length of a period of time in which said shutter means shifts from said second state to said first state.

16. Apparatus in accordance with claim 15, wherein said controlling means controls the length of said period of time so that it is substantially equal to an integral multiple of the repetition rate of said pulses.

17. Apparatus for irradiating an object, comprising a source of repetitive radiation pulses, shutter means, shiftable between a first state and a second state, for exposing said object to a plurality of said pulses during said second state and for preventing exposure of said object to said radiation during said first state, said shutter means requiring a period of time to shift from said first state to said second state and a period of time to shift from said second state to said first state, and a control system including means for synchronizing the beginning of said second state with a radiation pulse, means for controlling the duration of said second state, and means dependent upon the energy of said pulses for controlling the length of said period of time required for said shutter means to shift from said second state to said first state.

* * * * *